(12) United States Patent
Lin et al.

(10) Patent No.: US 10,325,963 B2
(45) Date of Patent: Jun. 18, 2019

(54) DISPLAY DEVICE

(71) Applicant: InnoLux Corporation, Miao-Li County (TW)

(72) Inventors: Hsiao-Lang Lin, Miao-Li County (TW); Jui-Jen Yueh, Miao-Li County (TW); Kuan-Feng Lee, Miao-Li County (TW); Jia-Yuan Chen, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 178 days.

(21) Appl. No.: 15/619,552

(22) Filed: Jun. 12, 2017

(65) Prior Publication Data

US 2018/0247979 A1     Aug. 30, 2018

Related U.S. Application Data

(60) Provisional application No. 62/462,999, filed on Feb. 24, 2017, provisional application No. 62/479,326, filed on Mar. 31, 2017.

(51) Int. Cl.
*G02B 5/30* (2006.01)
*H01L 27/32* (2006.01)
*H01L 33/06* (2010.01)
*G02F 1/1335* (2006.01)
*G02F 1/13357* (2006.01)

(52) U.S. Cl.
CPC .......... *H01L 27/322* (2013.01); *G02B 5/3041* (2013.01); *G02F 1/1336* (2013.01); *G02F 1/133528* (2013.01); *H01L 33/06* (2013.01); *G02F 2001/133614* (2013.01)

(58) Field of Classification Search
CPC ............ G02B 5/3041; G02F 1/133528; G02F 1/1336; G02F 2001/133614; H01L 27/322; H01L 33/06
See application file for complete search history.

(56) References Cited

U.S. PATENT DOCUMENTS

| 6,501,091 B1* | 12/2002 | Bawendi | B82Y 10/00 257/14 |
| 6,700,322 B1* | 3/2004 | Duggal | C09K 11/7774 252/301.4 F |
| 10,073,294 B1* | 9/2018 | Lin | G09G 3/20 |
| 2003/0127968 A1* | 7/2003 | Kuma | H01L 27/3211 313/503 |
| 2013/0214704 A1* | 8/2013 | Gerlach | H05B 33/0866 315/312 |
| 2017/0023829 A1* | 1/2017 | Im | G02F 1/133617 |
| 2018/0210291 A1* | 7/2018 | Lin | G02F 1/133617 |

* cited by examiner

*Primary Examiner* — Mihir K Rayan
(74) *Attorney, Agent, or Firm* — Winston Hsu

(57) ABSTRACT

The present disclosure provides a display unit of a display device including a light emitting unit and a light converting layer disposed on the light emitting unit. The display unit emits an output light under an operation of the highest gray level, the output light having an output spectrum, an intensity integral of the output spectrum from 380 nm to 470 nm defines as a first intensity integral, an intensity integral of the output spectrum from 580 nm to 780 nm defines as a second intensity integral, a ratio of the first intensity integral over the second intensity integral defines as a first ratio, and the first ratio is greater than 0% and less than or equal to 2.5%.

20 Claims, 9 Drawing Sheets

DISPLAY DEVICE

CROSS REFERENCE TO RELATED APPLICATION

This application claims the benefit of U.S. Provisional Application Ser. No. 62/462,999, filed Feb. 24, 2017 and U.S. Provisional Application Ser. No. 62/479,326, filed Mar. 31, 2017, the contents of which are hereby incorporated by reference in their entirety.

BACKGROUND OF THE DISCLOSURE

1. Field of the Disclosure

The present disclosure relates to a display device, and more particularly to a display device capable of generating red light which has a color close to the red primary color of DCI-P3 color gamut.

2. Description of the Prior Art

Display devices are configured to convert acquired or stored electric information into visual information and display it to a user. The color gamut of display devices, such as liquid crystal display (LCD), are referenced to NTSC (National Television System Committee) color gamut. With the advance of technology, in order to meet different color systems and display various colors, different color gamuts, such as sRGB, DCI (Digital Cinema Initiatives)-P3 and Rec. 2020 (ITU-R Recommendation BT.2020), have been defined. The DCI-P3 color gamut is one of the popular color gamuts and is widely applied to various digital monitors or TV.

However, the color temperature of the white light generated from a digital monitor, such as a laptop computer monitor or a desktop computer monitor, is usually less than that generated from a TV, which means the white light of the digital monitor is more reddish than that of the TV, thereby resulting in uncomfortableness of the user. Traditional method for adjusting color temperature or color tone is to change the spectrum of the light generated from a light-emitting material. Accordingly, to change the color temperature of the display device is complicated and also takes much time, thereby burdening the manufacturing cost.

SUMMARY OF THE DISCLOSURE

It is one of the objectives of the present disclosure to provide a display device capable of generating an output light which has a color temperature the same as the color temperature generated from the TV to improve the visual perception of the user.

According to an embodiment of the present disclosure, a display device is provided. A display unit of the display device includes a light emitting unit and a light converting layer disposed on the light emitting unit. The display unit emits an output light under an operation of the highest gray level, the output light having an output spectrum, an intensity integral of the output spectrum from 380 nm to 470 nm defines as a first intensity integral, an intensity integral of the output spectrum from 580 nm to 780 nm defines as a second intensity integral, a ratio of the first intensity integral over the second intensity integral defines as a first ratio, and the first ratio is greater than 0% and less than or equal to 2.5%.

According to another embodiment of the present disclosure, a display device is provided. The display device includes a backlight unit, a light modulating layer, a light converting layer, and a first polarization layer. The light modulating layer is disposed on the backlight unit. The light converting layer is disposed on the backlight unit. The first polarization layer is disposed between the light modulating layer and the light converting layer. A display unit is formed of at least a portion of the backlight unit, at least a portion of the light modulating layer, at least a portion of the light converting layer, and at least a portion of the first polarization layer, wherein the display unit emits an output light under an operation of the highest gray level, the output light having an output spectrum, an intensity integral of the output spectrum from 380 nm to 470 nm defines as a first intensity integral, an intensity integral of the output spectrum from 580 nm to 780 nm defines as a second intensity integral, a ratio of the first intensity integral over the second intensity integral defines as a first ratio, and the first ratio is greater than 0% and less than or equal to 2.5%

In the display device of the present disclosure, the first ratio can be adjusted easily by the thickness of the first converting layer or the area of the second layer to be greater than 0% and less than or equal to 2.5%, so that the color temperature of the display device can be easily adjusted to be the same as the color temperature generated from the TV, thereby improving the visual perception of the user and saving the manufacturing cost.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

It will be understood that when an element is referred to as being "on" another layer or substrate, it can be directly on the other element, or intervening elements may also be present. It will be understood that, although the terms first, second, third etc. may be used herein to describe various elements, components, sub-pixels, units, and/or layers, these elements, components, sub-pixels, units and/or layers should not be limited by these terms. These terms are used to distinguish one element, component, sub-pixel, unit and/or layer from another element, component, sub-pixel, unit and/or layer.

Figure 1:
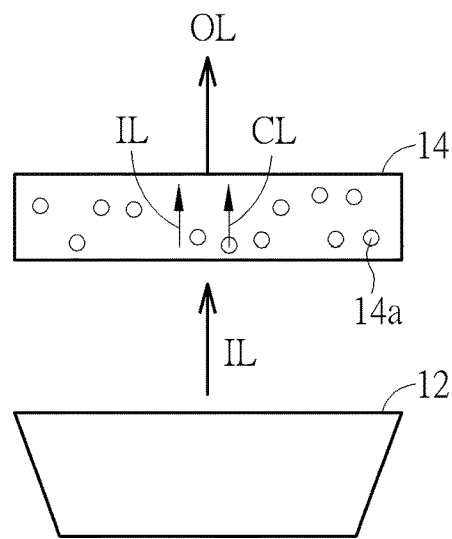
FIG. 1 is a schematic diagram illustrating a display unit according to an embodiment of the present disclosure.

Refer to FIG. 1, which is a schematic diagram illustrating a display unit of a display device according to an embodiment of the present disclosure. The display unit 10 includes a first light emitting unit 12 and a first light converting layer 14. The display unit 10 could emit an output light OL. The first light converting layer 14 is disposed on the first light emitting unit 12. Specifically, an input light IL with an input color emitted from the first light emitting unit 12 is incident onto the first light converting layer 14, and the first light converting layer 14 can convert the input light IL (with input spectrum) into the output light OL (with output spectrum). The first light converting layer 14 can absorb a part of the input light IL and convert the part of the input light IL into a converted light CL with a converted color different from the input color. Other part of the input light IL that is not absorbed by the first light converting layer 14 will penetrate through the first light converting layer 14. Accordingly, the converted light CL and the other part of the input light IL can be mixed with each other to form the output light OL emitted from the first light converting layer 14, and the output color of the first light converting layer 14 can be formed by mixing an input color of the input light IL and the converted color of the converted light CL. The main wavelength range of the input light IL should be less than the main wavelength range of the converted light CL, so the input light IL can be absorbed by the first light converting layer 14 and be converted into the output light OL. Furthermore, the output light OL has an output spectrum under an operation of a highest gray level. For example, for an 8-bit-deep image, the highest gray level may be 255, but not limited thereto.

In this embodiment, the first light emitting unit 12 may include a self-emissive blue light emitting diode, such as micro-sized light emitting diode (inorganic, called micro-LED) or organic light emitting diode (OLED), so that the input light emitted from the light emitting unit can be directly turned on or off by a switch electrically connected to the first light emitting unit, such as thin-film transistor (TFT), but not limited thereto, and the first light emitting unit 12 may be other kinds of self-emissive light emitting diodes. Also, a number of the micro-LED in the first light emitting unit 12 is not limited to be one, and may be plural. For example, the display unit 10 may include a substrate with a concavity. Since the size of the micro-LED is about micrometer-scale or smaller, at least one micro light emitting diode, for example two or three micro light emitting diodes generating similar spectrum, may be disposed in the concavity.

The first light converting layer 14 may include a quantum dot material, a color filter material or a phosphor material, or combination of at least two of those materials. When the first light converting layer 14 includes the quantum dot material, the first light converting layer 14 may include a plurality of quantum dots 14a. The quantum dot material is made of a semiconductor nano-crystal structure, and can be any one selected from CdSe, CdS, CdTe, ZnSe, ZnTe, ZnS, HgTe, InAs, $Cd_{1-x}Zn_xSe_{1-y}S_y$, CdSe/ZnS, InP, and GaAs.

Figure 2:
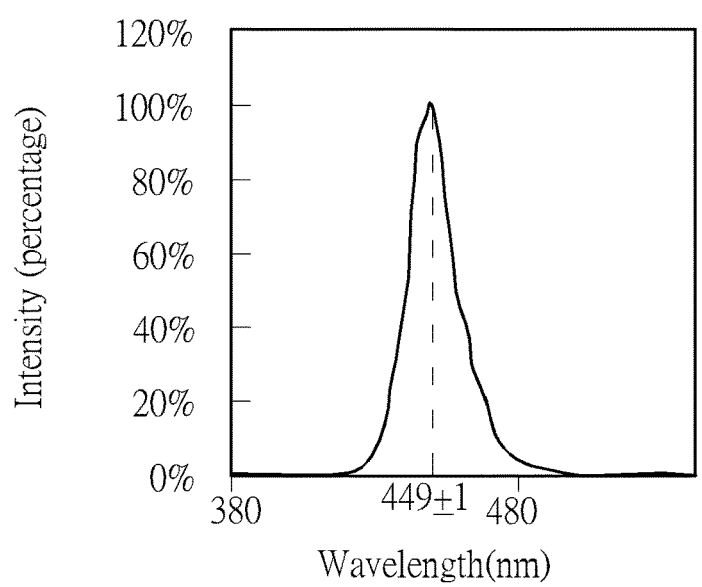
FIG. 2 is a schematic diagram illustrating the input spectrum of the input light.

Refer to FIG. 2, which is a schematic diagram illustrating the input spectrum of the input light. The input spectrum has a wave, in which the wave has an intensity peak (local maximum intensity) and a FWHM (Full Width at Half Maximum). The intensity peak of the input spectrum ranges from 448 nm to 450 nm, and the FWHM of the input spectrum may ranges from 10 nm to 30 nm, for example ranges from 17 nm to 19 nm. Accordingly, the input color of the input light may be blue.

Figure 3:
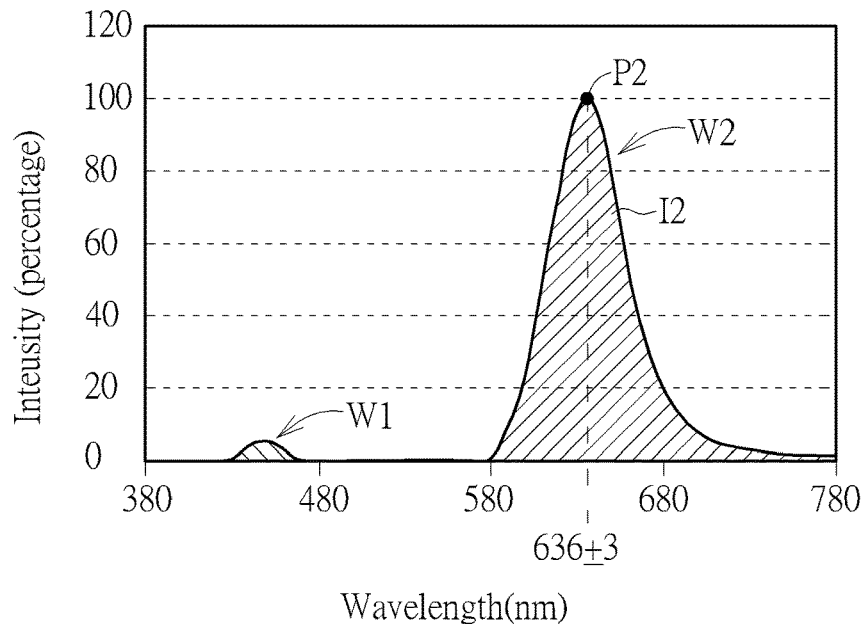
FIG. 3 is a schematic diagram illustrating the output spectrum of the output light.
Figure 4:
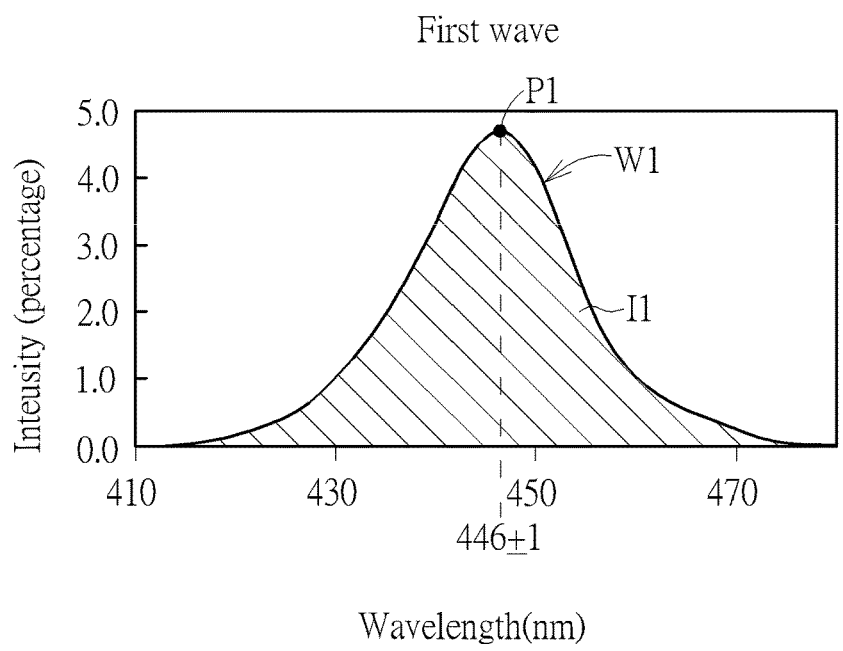
FIG. 4 is an enlarged schematic diagram of a first wave shown in FIG. 3.

Refer to FIG. 3 and FIG. 4. FIG. 3 is a schematic diagram illustrating the output spectrum of the output light, and FIG. 4 is an enlarged schematic diagram of a first wave shown in FIG. 3. Since the output light OL is emitted by mixing the converted light CL with the converted color and the other part of the input light IL with the input color, the output spectrum of the output light OL may include a first wave W1 (main) and a second wave W2 (sub). The first wave W1 may represent the other part of the input light IL that penetrates through the first light converting layer 14, and may ranges from 380 nm to 470 nm. The first wave W1 has a first intensity peak P1 that is a maximum peak of the output spectrum from 380 nm to 470 nm. Accordingly, the first wave W1 may correspond to blue light. Because a large part of the input light IL is absorbed by the first light converting layer 14, the first intensity peak P1 is slightly different from the intensity peak of the input spectrum and ranges from 445 nm to 447 nm. The second wave W2 may represent the converted light CL generated from the first light converted layer 14, and may ranges from 580 nm to 780 nm. Accordingly, the second wave W2 may correspond to red light. The second wave W2 has a second intensity peak P2 that is a maximum peak of the output spectrum from 580 nm to 780 nm and ranges from 633 nm to 639 nm. Since a major part of the input light IL is absorbed by the first light converting layer 14, the intensity of the second intensity peak P2 is much greater than the intensity of the first intensity peak P1, and the output color of the output light OL can be similar to but not the same as the red converted color of the converted light CL. Also, through having the first wave W1 with less intensity, the output color may be slightly bluish. In this embodiment, there is no wave between the first wave W1 and the second wave W2, so the red color of the second wave W1 is not mixed with other color except the blue color of the first wave W1.

Specifically, an intensity integral of the output spectrum from 380 nm to 470 nm, which is the intensity integral of the first wave W1, defines as a first intensity integral I1. The first intensity integral I1 may represent the energy of the other part of the input light IL that is not absorbed by the first light converting layer 14. An intensity integral of the output spectrum from 580 nm to 780 nm, which is the intensity integral of the second wave W2, defines as a second intensity integral I2. The second intensity integral I2 may represent the energy of the converted light CL. A ratio of the first intensity integral I1 over the second intensity integral I2 (I1/I2) in the optical spectrum defines as a first ratio. The output color of the output light OL can be determined based on the first ratio. In this embodiment, the first ratio is greater than 0% and less than or equal to 2.5%. For example, the first ratio may be less than or equal to 1.7%. Furthermore, a ratio of the first intensity peak P1 over the second intensity peak P2 (P1/P2) defines as a second ratio, and the second ratio can be greater than 0% and less than or equal to 5.5%. Also, the wavelengths of the second wave W2 at the FWHM may be for example 610 nm and 660 nm, so the FWHM of the second wave W2 may be for example 50 nm. When the first light converting layer 14 is formed of the quantum dots 14a, the size of each quantum dot 14a may for example range from 4 nm to 6 nm.

Figure 5:
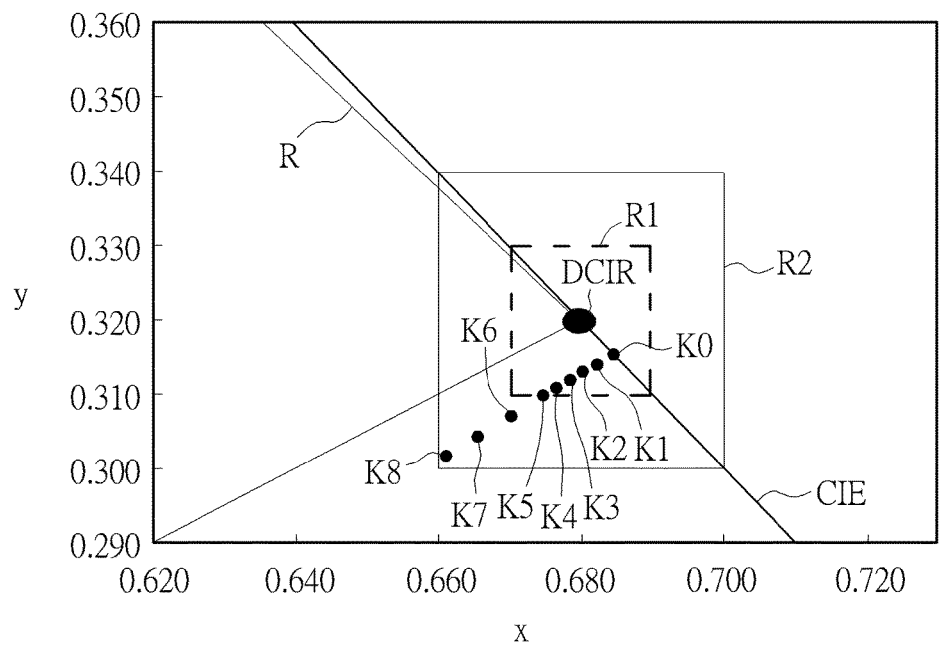
FIG. 5 is a CIE1931 xy chromaticity diagram illustrating points of the output spectrums of the output lights with different first ratios and different second ratios, the DCI-P3 color gamut and the CIE 1931 color space.
Figure 6:
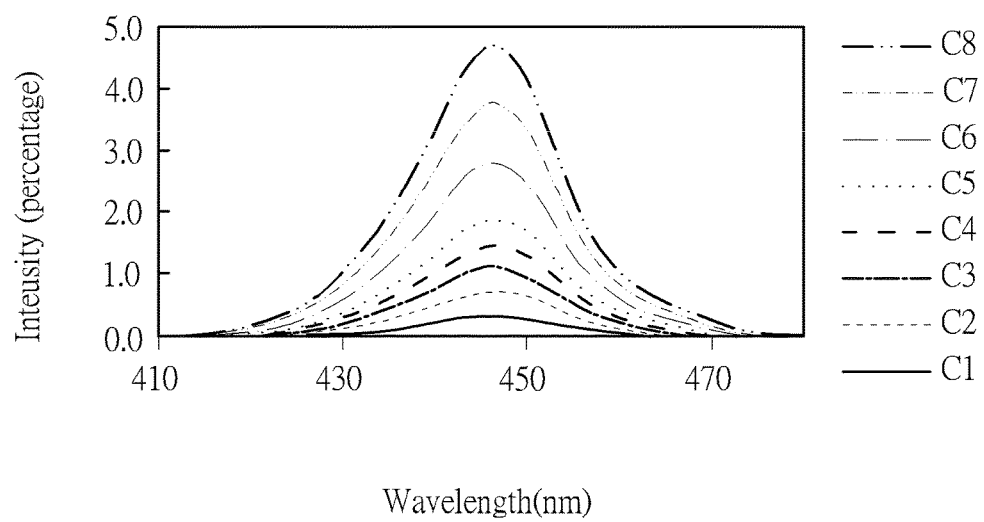
FIG. 6 is an enlarged schematic diagram illustrating different first waves with different first ratios corresponding to the points shown in FIG. 5 while the intensity of the second intensity peak of the corresponding second wave is 100%.

Refer to FIG. 5 and FIG. 6 as well as Table 1. FIG. 5 is a CIE 1931 xy chromaticity diagram illustrating points of the output spectrums of the output lights with different first ratios and different second ratios, the DCI-P3 color gamut and the CIE 1931 color space, and FIG. 6 is an enlarged schematic diagram illustrating different first waves with different first ratios corresponding to the points shown in FIG. 5 while the intensity of the second intensity peak of the corresponding second wave is 100%. The x-coordinate values and y-coordinate values of the points, the shifts Δx and Δy from the point DCIR to the points, the corresponding first ratios, and the corresponding second ratios are listed in the following Table 1. A curve CIE represents a boundary of the CIE 1931 color space; a region R represents the DCI-P3 color gamut, in which a point DCIR represents the red primary color thereof; a block R1 represents a color with a shift of 0.020 from the point DCIR in x-coordinate or in y-coordinate; and a block R2 represents a color with a shift of 0.010 from the point DCIR in x-coordinate or in y-coordinate. The point DCIR has an x-coordinate value and a y-coordinate value of (0.680, 0.320), which is on the curve CIE. A point K0 representing the color of the second wave W2 with no first wave W1 is on the curve CIE. The point K0 is inside the block R1, so the point K0 is close to the point DCIR enough to show almost the same color as the point DCIR. Also, the points K1 to K8 correspond to output spectrums C1 to C8 respectively, in which the output spectrum C1 represents the condition of the first ratio being 0.1%; the output spectrum C2 represents the condition of the first ratio being 0.3%; the output spectrum C3 represents the condition of the first ratio being 0.4%; the output spectrum C4 represents the condition of the first ratio being 0.6%; the output spectrum C5 represents the condition of the first ratio being 0.7%; the output spectrum C6 represents the condition of the first ratio being 1.0%; the output spectrum C7 represents the condition of the first ratio being 1.4%; and the output spectrum C8 represents the condition of the first ratio being 1.7%. Based on the above-mentioned, when the first ratio is greater than 0% and equal to or less than 2.5% or the second ratio is greater than 0% and equal to or less than 5.5%, the color of the points K1 to K8 may be adjusted to be slightly bluish, and at the same time, the color of the points K1 to K8 is still close to the point DCIR enough to be used as a red light source, such as red sub-pixel. For example, the color of the points K1 to K8 can be inside the block R2. It should be noted that because the first wave W1 is from the input light, the output color of the output light OL can be adjusted to be slightly bluish to match the requirements. For example, when the display unit 10 is used as the red sub-pixel, the white color generated from the red sub-pixel, a blue sub-pixel and a green sub-pixel can be slightly shifted to be bluish, thereby increasing the color temperature thereof. Accordingly, the color temperature of a display device using the display unit 10 can be the same as the color temperature generated from the TV by adjusting the first ratio so as to improve the visual perception of the user.

TABLE 1

| point | K8 | K7 | K6 | K5 | K4 | K3 | K2 | K1 | K0 |
|---|---|---|---|---|---|---|---|---|---|
| first ratio | 1.7% | 1.4% | 1.0% | 0.7% | 0.6% | 0.4% | 0.3% | 0.1% | 0.0% |
| second ratio | 4.7% | 3.8% | 2.8% | 1.9% | 1.5% | 1.1% | 0.8% | 0.4% | 0.0% |
| x | 0.661 | 0.666 | 0.670 | 0.675 | 0.677 | 0.679 | 0.681 | 0.682 | 0.684 |
| y | 0.302 | 0.304 | 0.307 | 0.310 | 0.311 | 0.312 | 0.313 | 0.314 | 0.315 |
| Δx | −0.019 | −0.014 | −0.010 | −0.005 | −0.003 | −0.001 | 0.001 | 0.002 | 0.004 |
| Δy | −0.018 | −0.016 | −0.013 | −0.010 | −0.009 | −0.008 | −0.007 | −0.006 | −0.005 |

Figure 7:
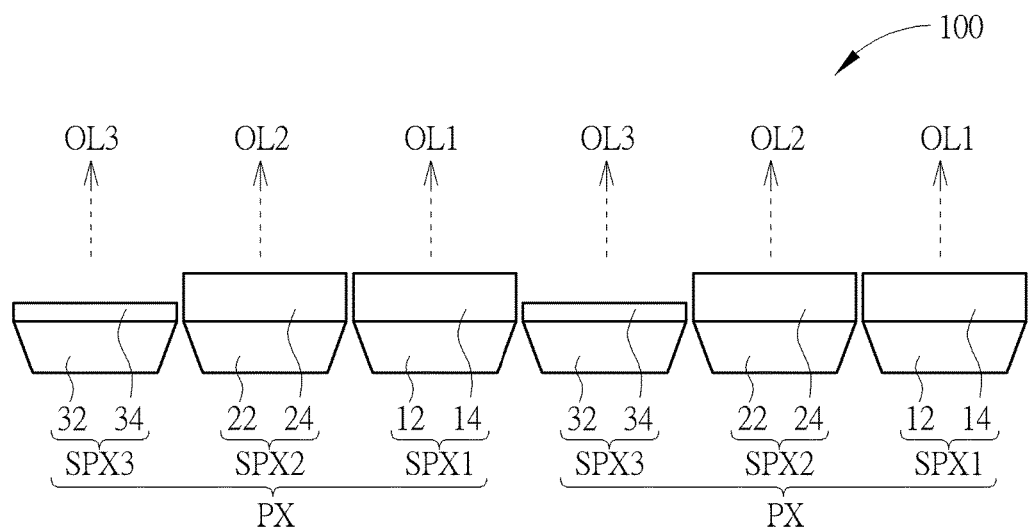
FIG. 7 is a schematic diagram illustrating a display device according to the first embodiment of the present disclosure.

The above-mentioned display unit 10 may be used as a sub-pixel of a display device. Refer to FIG. 7, which is a schematic diagram illustrating a display device according to the first embodiment of the present disclosure. The display device 100 may include a plurality of pixels PX, and each pixel PX may include at least two sub-pixels. In this embodiment, the pixel PX includes three sub-pixels, and one of the three sub-pixels of each pixel PX may be a red sub-pixel SPX1 that uses the above-mentioned display unit 10. Specifically, the red sub-pixel SPX1 may include the first light emitting unit 12 and the first light converting layer 14 so as to generate the first output light OL1 with the red output color close to the red primary color of DCI-P3 color gamut that meets the requirements. Also, the other two sub-pixels of each pixel PX may respectively be a green sub-pixel SPX2 and a blue sub-pixel SPX3, but not limited thereto. The green sub-pixel SPX2 may include a second light emitting unit 22 and a second light converting layer 24 disposed on the second light emitting unit 22. For example, the second light emitting unit 22 may be the same as the first light emitting unit 12, which is a blue light emitting diode, but not limited thereto. The second light converting layer 24 may include a quantum dot material, a color filter material or a phosphor material. The second light converting layer 24 can be used to absorb the light generated from the second light emitting unit 22 and generate another converted light, so that a second output light OL2 can be emitted from the second light converting layer 24. As compared with the first light converting layer 14, the converted light generated from the second light converting layer 24 is green. For example, the peak wavelength of the second light converting layer 24 may ranges from 525 nm to 535 nm, and when the second light converting layer 24 includes quantum dots, the size of each quantum dot may be for example 3.3 nm, but not limited thereto. Also, in order to emit green light, the second light converting layer 24 should absorb most of or all of the input light, so that the color of the output light OL2 from the second converting layer 24 can be close to or the same as the green primary color of DCI-P3 color gamut.

Additionally, the blue sub-pixel SPX3 may include a third light emitting unit 32. For example, the third light emitting unit 32 may be the same as the first light emitting unit 12, which is a blue light emitting diode, but not limited thereto. When the third light emitting unit 32 meets the requirements, the blue sub-pixel SPX3 may not include light converting layer. If some requirements are needed, the blue sub-pixel SPX3 may selectively include a third light converting layer 34 disposed on the third light emitting unit 32. The third light converting layer 34 may include a quantum dot material, a color filter material or a phosphor material. The third light converting layer 34 can also be used to change the blue light of the third light emitting unit 32 to be close to the blue primary color of the DCI-P3 color gamut. For example, when the third light converting layer 34 is formed of the quantum dots, the size of each quantum dot may range from 2 nm to 3 nm. Also, the intensity peak of the converted light of the third light converting layer 34 may range from 522 nm to 524 nm, and the FWHM of the converted light of the third light converting layer 34 may range from 20 nm to 60 nm, for example range from 35 nm to 37 nm. The thickness of the third light converting layer 34 may be less than the thickness of the first light converting layer 14 and the thickness of the second light converting layer. It will be understood that the display device 100 may further include other display elements, such as data lines, scan lines, TFTs, electrodes, substrates, polarization layers, optical films, insulating layers, encapsulation layers, or other elements or layers.

The display device is not limited by the aforementioned embodiment, and may have other different variant embodiments or embodiments. To simplify the description, the identical components in each of the following variant embodiments or embodiments are marked with identical symbols. For making it easier to compare the difference between the first embodiment and the variant embodiment and the difference between the first embodiment and other embodiments, the following description will detail the dissimilarities among different variant embodiments or embodiments and the identical features will not be redundantly described. The display unit may include at least a portion of elements or layers, for example the red sub-pixel SPX1 may include the first light emitting unit 12, the first light converting layer 14, and a portion of a corresponding polarization layer. The shift effect of first ratio, second ratio, and color hue (x-coordinate value, y-coordinate value) by those elements and layers may be ignorable, and the dominant effective factor are the light emitting unit and the light converting layer. The output light could be regarded as the final visual light of the display device to the user (observer).

Figure 8:
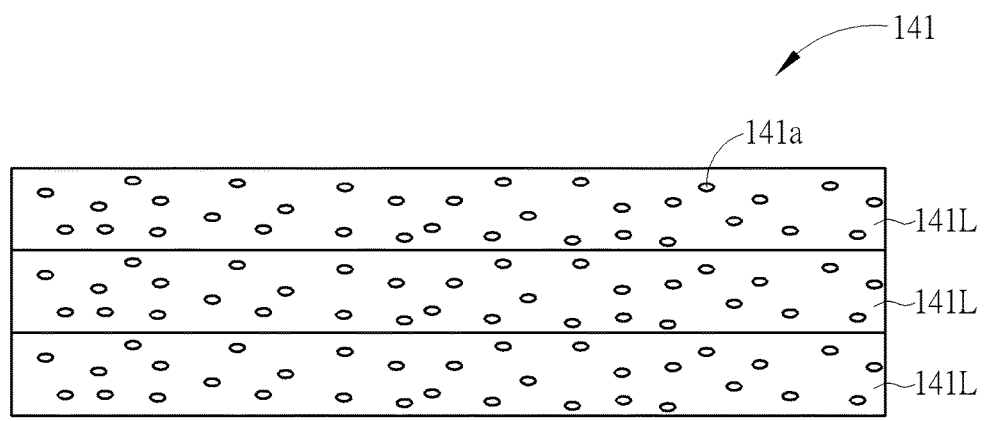
FIG. 8 is a schematic diagram illustrating a display unit according to a first variant embodiment of the first embodiment of the present disclosure.

Refer to FIG. 8, which is a schematic diagram illustrating a display unit according to a first variant embodiment of the first embodiment of the present disclosure. As compared with the first embodiment, the first light converting layer 141 may include a multilayer structure. Specifically, the multilayer structure may include a plurality of quantum dot layers 141L stacked in sequence, in which each quantum dot layer 141L includes a plurality of quantum dots 141a. The thickness of the first light converting layer 141 may be adjusted by the number of the quantum dot layers 141L, thereby adjusting the first ratio. The quantum dots 141a may be substantially the same as the quantum dots of the first light converting layer in first embodiment and will not be redundantly detailed.

Figure 9:
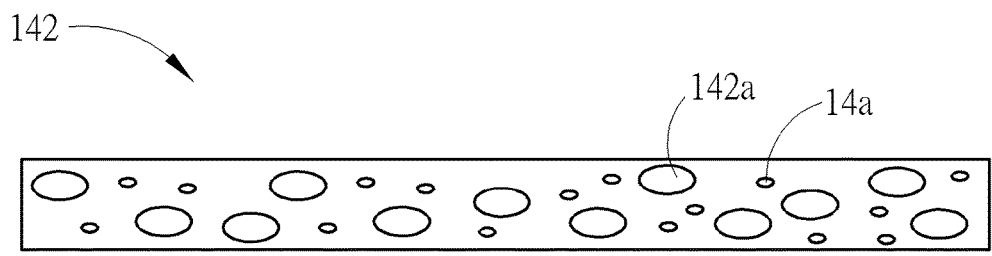
FIG. 9 is a schematic diagram illustrating a display unit according to a second variant embodiment of the first embodiment of the present disclosure.

Refer to FIG. 9, which is a schematic diagram illustrating a display unit according to a second variant embodiment of the first embodiment of the present disclosure. As compared with the first embodiment, the first light converting layer 142 of this variant embodiment may further include at least one pigment material. Specifically, the first light converting layer 142 may include a plurality of pigment particles 142a which can filter and absorb light of a specific wavelength range. Accordingly, through the pigment particles, the first intensity integral of the first wave may be changed or reduced to adjust or lower the first ratio. In other words, because of the pigment particles 142a, a thickness of the first light converting layer 142 may be less than that of the first embodiment while the first ratio of this variant embodiment is the same as the first embodiment. Depending on the characteristic of the pigment material of the pigment particles 142a, the first intensity peak of the first wave may be slightly changed or not. A size of each of pigment particles 142a, for example 50 nm, is greater than the size of each quantum dot 14a. For instance, the pigment material may include purple pigment V23, blue pigment B15:6, green pigment G36, green pigment G58, yellow pigment Y150, red pigment R177 or red pigment 254, but not limited thereto. In another variant embodiment, the pigment particles 142a may be formed of a plurality of pigment materials, such as two or three pigment materials, and the pigment materials may include at least two of the above-mentioned pigment materials, such as a combination of green pigment G36 and red pigment 254, but not limited thereto.

Figure 10:
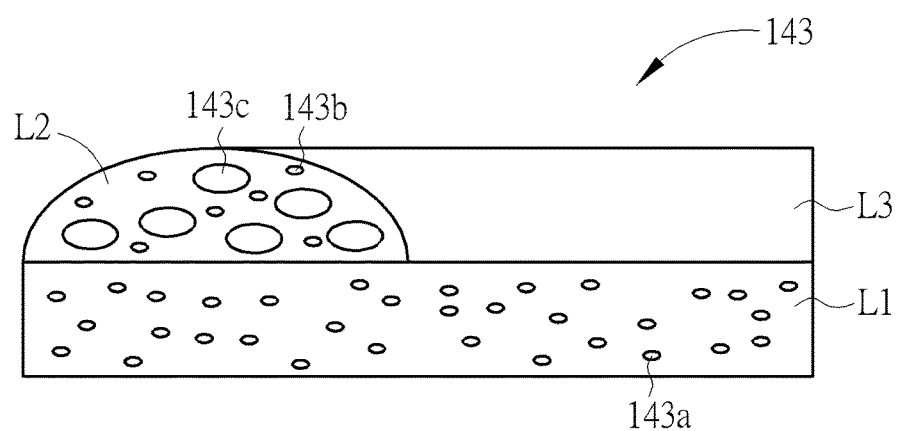
FIG. 10 is a schematic diagram illustrating a display unit according to a third variant embodiment of the first embodiment of the present disclosure.

Refer to FIG. 10, which is a schematic diagram illustrating a display unit according to a third variant embodiment of the first embodiment of the present disclosure. The first light converting layer 143 of this variant embodiment may include a first layer L1 and a second layer L2 stacked on the first layer L1, in which the first layer L1 includes a quantum dot material, and the second layer L2 includes at least one pigment material. In this variant embodiment, the second layer L2 doesn't cover the first layer L1, and a width of the second layer L2 is less than a width of the first layer L1. Specifically, the first layer L1 may include a plurality of quantum dots 143a, and the second layer L2 may include a plurality of quantum dots 143b and a plurality of pigment particles 143c. Also, the first light converting layer 143 may further include a transparent layer L3 disposed on (stacked on) the first layer L1, the transparent layer L3 is adjacent to the second layer L2, and a combination of the second layer L2 and the transparent layer L3 covers the first layer. A top surface of the second layer L2 may be leveled with a top surface of the transparent layer L3. In another variant embodiment, the pigment particles 143b may be formed of a plurality of pigment materials. In still another variant embodiment, the second layer L2 may not include the quantum dots 143b. In another embodiment, the second layer L2 may not be stacked on the first layer L1, and the second layer L2 may be disposed aside the first layer L1. In another embodiment, the first light converting layer 143 may include a plurality of first layers L1 and a plurality of second layers L2, and each first layer L1 and each second layer L2 are alternately stacked.

Figure 11:
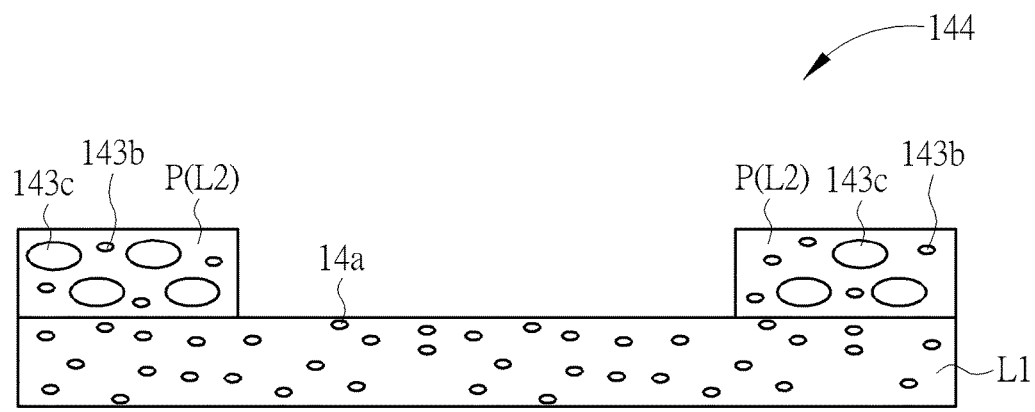
FIG. 11 is a schematic diagram illustrating a display unit according to a fourth variant embodiment of the first embodiment of the present disclosure.

Refer to FIG. 11, which is a schematic diagram illustrating a display unit according to a fourth variant embodiment of the first embodiment of the present disclosure. In the first light converting layer 144 of the fourth variant embodiment, the second layer L2 may include a plurality of portions P separated from each other, and each portion P includes a plurality of quantum dots 143b and a plurality of pigment particles 143c. For example, the portions P may be disposed near or on the edges of the first layer L1 respectively. In another variant embodiment, each portion P may not include the quantum dots 143b.

Figure 12A:
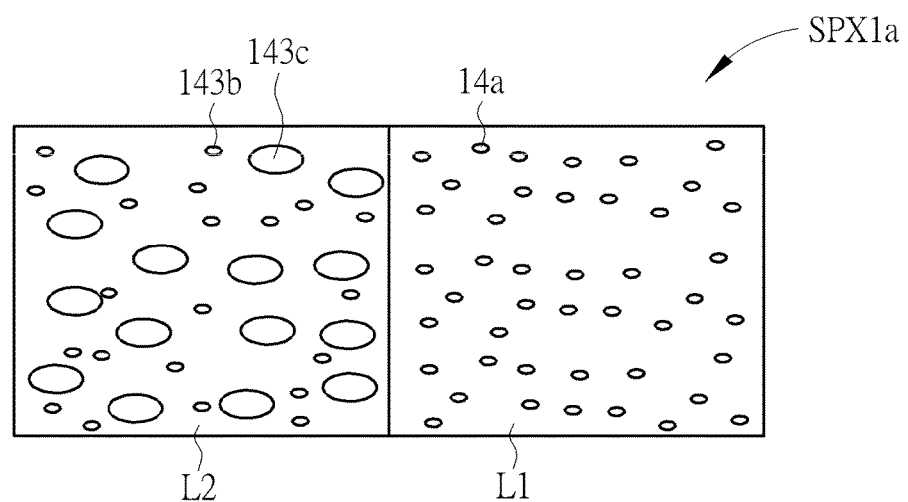
FIG. 12a to FIG. 12d are schematic diagrams illustrating top views of the display device according to a fifth variant embodiment to an eighth variant embodiment of the first embodiment of the present disclosure.
Figure 12B:
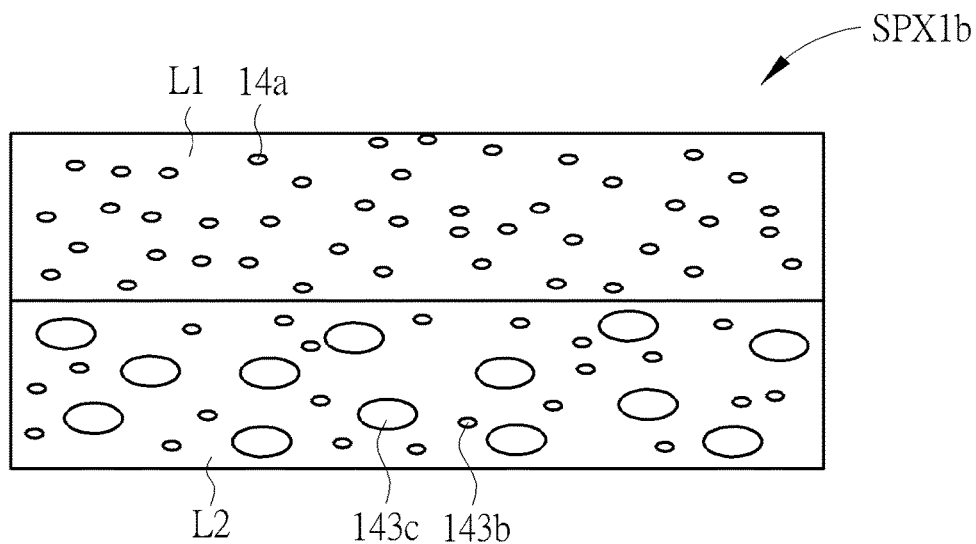
Figure 12C:
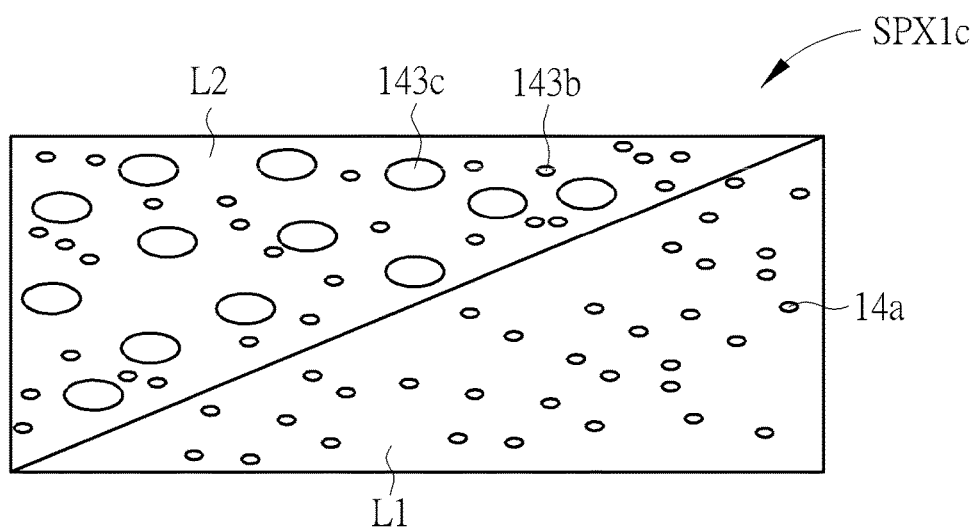
Figure 12D:
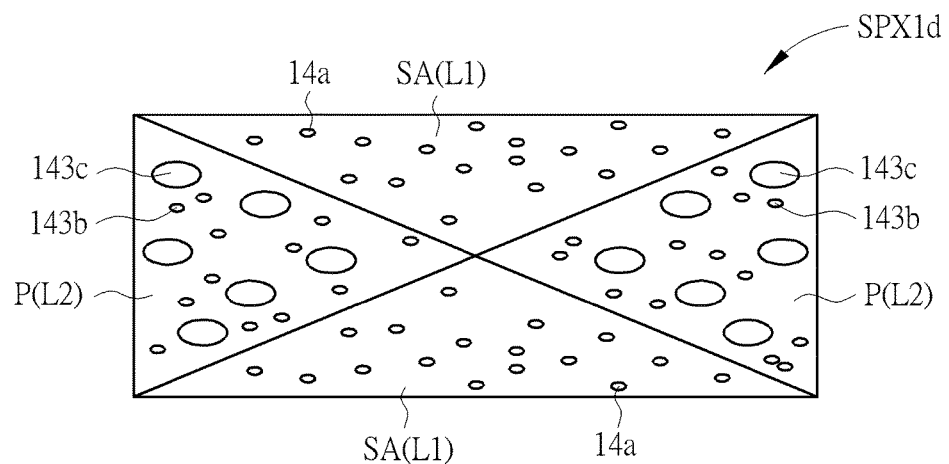

Refer to FIG. 12a to FIG. 12d, which are a schematic diagrams illustrating top views of the display device according to a fifth variant embodiment to an eighth variant embodiment of the first embodiment of the present disclosure. As shown in FIG. 12a, in the sub-pixel SPX1a of the fifth variant embodiment, a first area of the first layer L1 that is not covered with the second layer L2 may be the same as a second area of the second layer L2. Also, a separate line for separating the first area and the second area may be along a direction of a short edge of the sub-pixel SPX1a. As shown in FIG. 12b, in the sub-pixel SPX1b of the sixth variant embodiment, the separate line for separating the first area and the second area may be along a direction of a long edge of the sub-pixel SPX1b. As shown in FIG. 12c, in the sub-pixel SPX1c of the seventh variant embodiment, the separate line for separating the first area and the second area may be along a diagonal line of the sub-pixel SPX1c. As shown in FIG. 12d, in the sub-pixel SPX1d of the eighth variant embodiment, the second layer L2 may include two portions P, and the first area of the first layer L1 may also be divided into two sub-areas SA. The portions P of the second layer L2 and the regions of the first layer L1 may be separated by two diagonal lines of the sub-pixel SPX1d.

Figure 13:
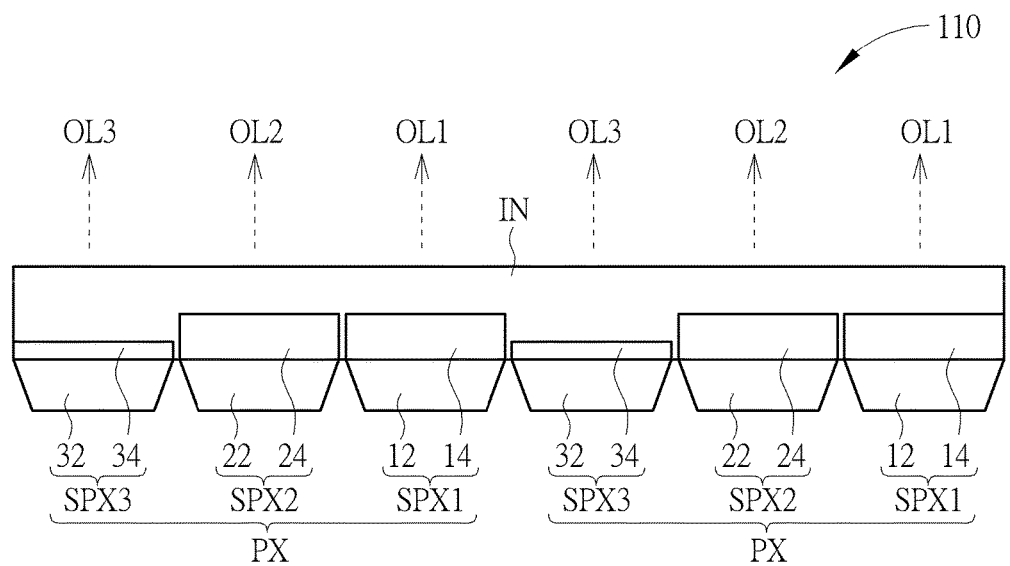
FIG. 13 is a schematic diagram illustrating a display device according to a ninth variant embodiment of the first embodiment of the present disclosure.

Refer to FIG. 13, which is a schematic diagram illustrating a display device according to a ninth variant embodiment of the first embodiment of the present disclosure. As compared with the first embodiment, the display device 110 of this variant embodiment further includes an insulation layer IN covering the pixels PX. The insulation layer IN may be formed of an organic material, such as photoresist material, or an inorganic material, such as silicon nitride or silicon oxide. When the insulation layer is formed of organic material, the insulation layer IN may be easy to flatten the top surface of the insulation layer IN. When the insulation layer IN is formed of inorganic material, the insulation layer IN may have better resistance, which helps to apply to touch devices. In another variant embodiment, the insulation layer IN may be formed of multilayer structure, and the multilayer structure may be a stack of the organic material and the inorganic material.

Figure 14:
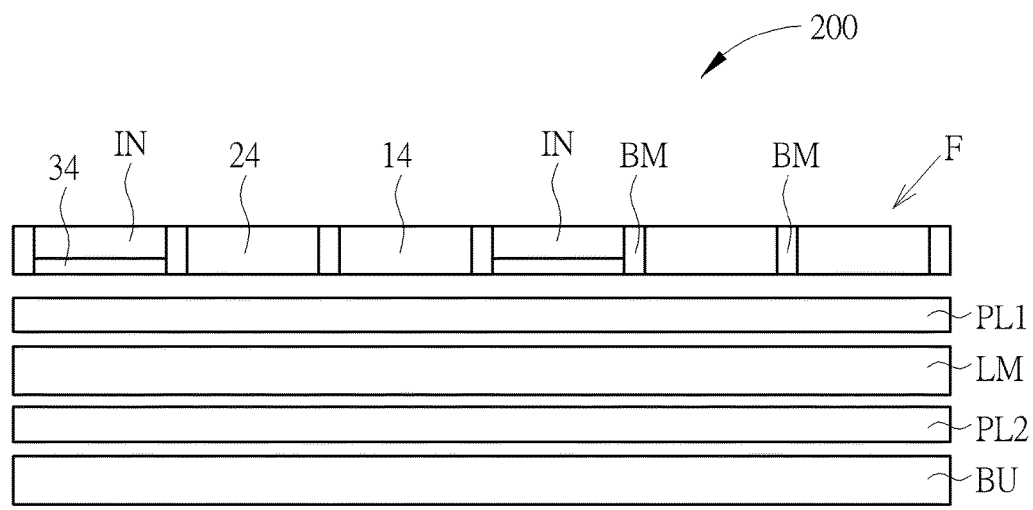
FIG. 14 is a schematic diagram illustrating a display device according to a second embodiment of the present disclosure.

Refer to FIG. 14, which is a schematic diagram illustrating a display device according to a second embodiment of the present disclosure. As shown in FIG. 14, the display device 200 may include a backlight unit BU, a light modulating layer LM, a first light converting layer 14 and a first polarization layer PL1. The light modulating layer LM may be for example a liquid crystal layer or a liquid crystal panel used for modulating the liquid crystal of the sub-pixels to different refractive states. It will be understood that the display device 200 may further include other display elements, such as data lines, scan lines, TFTs, substrates, optical films, insulating layers, encapsulation layers, or other elements to control the switches of the pixels. Specifically, the display device 200 may include a film F which includes a plurality of the first light converting layers 14, a plurality of the second light converting layers 24 and a plurality of third light converting layers 34. Each first light converting layer 14, each second light converting layer 24 and each third light converting layer 34 may be arranged alternately, and there is a black matrix BM may disposed between any two adjacent light converting layers. In other words, the first light converting layers 14, the second light converting layers 24, the third light converting layers 34 and the black matrix BM may form the film F. In other embodiments, the black matrix BM could be replaced by stacked light converting layers, or there is no the black matrix BM. In this embodiment, the film F is disposed on the backlight unit BU, and the first polarization layer PL1 and the light modulating layer LM is disposed between the backlight unit BU and the film F, in which the first polarization layer PL1 is disposed between the light modulating layer LM and the first light converting layer 14. The display device 200 may further include a second polarization layer PL2 disposed between the light modulating layer LM and the backlight unit BU, so that the light modulating layer LM is disposed between the first polarization layer PL1 and the second polarization layer PL2. The input light emitted from the backlight unit BU can be converted into output lights respectively by each first light converting layer 14, each second light converting layer 24 and each third light converting layer 34. The backlight unit BU may generate the input light the same as the input light of the first embodiment. For example, the backlight unit BU may include a plurality of light emitting units of the first embodiment. In the embodiment, a display unit may include a light emitting unit, a portion of the corresponding backlight unit BU, a portion of the corresponding light modulating layer LM, and a portion of the polarization layer PL. The shift effect of first ratio, second ratio, and color hue (x-coordinate value, y-coordinate value) by those elements and layers may be ignorable, and the dominant effective factor are the backlight unit and the light converting layer. The output light could be regarded as the final visual light of the display device to the user (observer).

Figure 15:
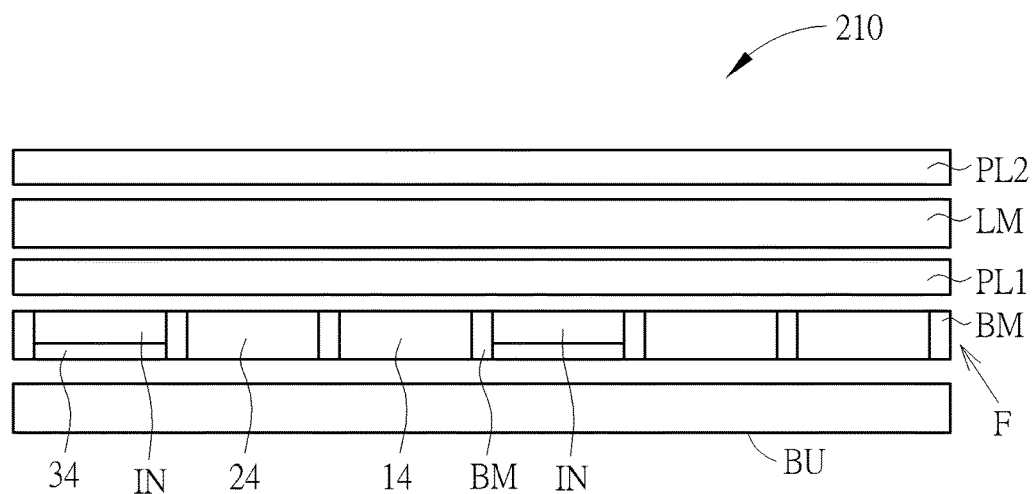
FIG. 15 is a schematic diagram illustrating a display device according to a variant embodiment of the second embodiment of the present disclosure.

Refer to FIG. 15, which is a schematic diagram illustrating a display device according to a variant embodiment of the second embodiment of the present disclosure. As shown in FIG. 15, as compared with the second embodiment, in the display device 210 of this variant embodiment, the film F including the first light converting layers 14, the second light converting layers 24 and the third light converting layers 34 is disposed between the backlight unit BU and the light modulating layer LM. Also, the first polarization layer PL1 is disposed between the backlight unit BU and the light modulating layer LM, and the light modulating layer LM is disposed between the second polarization layer PL2 and the backlight unit BU. In the embodiment, a display unit may include a light emitting unit, a portion of the corresponding backlight unit BU, a portion of the corresponding light modulating layer LM, and a portion of the polarization layer PL. The shift effect of first ratio, second ratio, and color hue (x-coordinate value, y-coordinate value) by those elements and layers may be ignorable, and the dominant effective factor are the backlight unit and the light converting layer. The output light could be regarded as the final visual light of the display device to the user (observer).

In summary, the first ratio can be adjusted easily by the thickness of the first converting layer or the area of the second layer to be greater than 0% and less than or equal to 2.5% in the display device of the present disclosure, so that the color temperature of the display device can be easily adjusted to be substantially the same as the color temperature generated from the TV, thereby improving the visual perception of the user and saving the manufacturing cost.

Those skilled in the art will readily observe that numerous modifications and alterations of the device and method may be made while retaining the teachings of the disclosure.

Accordingly, the above disclosure should be construed as limited only by the metes and bounds of the appended claims.

What is claimed is:

1. A display device, comprising:
    a display unit, comprising:
    a light emitting unit; and
    a light converting layer disposed on the light emitting unit,
    wherein the display unit emits an output light under an operation of the highest gray level, the output light having an output spectrum, an intensity integral of the output spectrum from 380 nm to 470 nm defines as a first intensity integral, an intensity integral of the output spectrum from 580 nm to 780 nm defines as a second intensity integral, a ratio of the first intensity integral over the second intensity integral defines as a first ratio, and the first ratio is greater than 0% and less than or equal to 2.5%.

2. The display device of claim 1, wherein the output spectrum comprises a first intensity peak and a second intensity peak, the first intensity peak is a maximum peak of the output spectrum from 380 nm to 470 nm, the second intensity peak is a maximum peak of the output spectrum from 580 nm to 780 nm, a ratio of the first intensity peak over the second intensity peak defines as a second ratio, and the second ratio is greater than 0% and less than or equal to 5.5%.

3. The display device of claim 1, wherein the light converting layer comprises a quantum dot material, a color filter material, or a phosphor material.

4. The display device of claim 3, wherein the light converting layer further comprises a multilayer structure.

5. The display device of claim 3, wherein the light converting layer further comprises at least one pigment material.

6. The display device of claim 1, wherein the light converting layer comprises a first layer and a second layer, the second layer is disposed on the first layer, the first layer comprises a quantum dot material, and the second layer comprises at least one pigment material.

7. The display device of claim 6, wherein in a cross-section view, a width of the second layer is less than a width of the first layer.

8. The display device of claim 6, wherein the second layer comprises a plurality of portions separated from each other.

9. A display device, comprising:
    a backlight unit;
    a light modulating layer disposed on the backlight unit;
    a light converting layer disposed on the backlight unit; and
    a first polarization layer disposed between the light modulating layer and the light converting layer,
    wherein a display unit is formed of at least a portion of the backlight unit, at least a portion of the light modulating layer, at least a portion of the light converting layer, and at least a portion of the first polarization layer,
    wherein the display unit emits an output light under an operation of the highest gray level, the output light having an output spectrum, an intensity integral of the output spectrum from 380 nm to 470 nm defines as a first intensity integral, an intensity integral of the output spectrum from 580 nm to 780 nm defines as a second intensity integral, a ratio of the first intensity integral over the second intensity integral defines as a first ratio, and the first ratio is greater than 0% and less than or equal to 2.5%.

10. The display device of claim 9, wherein the output spectrum comprises a first intensity peak and a second intensity peak, the first intensity peak is a maximum peak of the output spectrum between 380 nm to 470 nm, the second intensity peak is a maximum peak of the output spectrum between 580 nm to 780 nm, a ratio of the first intensity peak over the second intensity peak defines as a second ratio, and the second ratio is greater than 0% and less than or equal to 5.5%.

11. The display device of claim 9, further comprising a second polarization layer, wherein the light modulating layer is disposed between the first polarization layer and the second polarization layer.

12. The display device of claim 11, wherein the light modulating layer is disposed between the backlight unit and the light converting layer.

13. The display device of claim 11, wherein the light converting layer is disposed between the backlight unit and the light modulating layer.

14. The display device of claim 9, wherein the light converting layer comprises a quantum dot material, a color filter material, or a phosphor material.

15. The display device of claim 14, wherein the light converting layer further comprises a multilayer structure.

16. The display device of claim 14, wherein the light converting layer further comprises at least one pigment material.

17. The display device of claim 9, wherein the light converting layer comprises a first layer and a second layer, the second layer is disposed on the first layer, the first layer comprises a quantum dot material, and the second layer comprises at least one pigment material.

18. The display device of claim 17, wherein in a cross-section view, a width of the second layer is less than a width of the first layer.

19. The display device of claim 17, wherein the second layer comprises a plurality of portions separated from each other.

20. The display device of claim 17, wherein the light converting layer further comprises a transparent layer, the transparent layer is disposed on the first layer, and the transparent layer is adjacent to the second layer.

* * * * *